(12) United States Patent
Scoones et al.

(10) Patent No.: US 12,372,559 B2
(45) Date of Patent: Jul. 29, 2025

(54) CURRENT SENSING FOR POWER CONVERTER

(71) Applicant: TEXAS INSTRUMENTS INCORPORATED, Dallas, TX (US)

(72) Inventors: Kevin Scoones, Santa Clara, CA (US); Vamsinath Peddireddy, San Jose, CA (US); Orlando Lazaro, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 7 days.

(21) Appl. No.: 18/192,759

(22) Filed: Mar. 30, 2023

(65) Prior Publication Data

US 2023/0314484 A1    Oct. 5, 2023

Related U.S. Application Data

(60) Provisional application No. 63/325,842, filed on Mar. 31, 2022.

(51) Int. Cl.
     *G01R 19/00*          (2006.01)
     *H02M 1/00*          (2007.01)
     *H02M 3/07*          (2006.01)

(52) U.S. Cl.
     CPC ...... *G01R 19/0038* (2013.01); *H02M 1/0009* (2021.05); *H02M 3/07* (2013.01)

(58) Field of Classification Search
     CPC .. G01R 19/00; G01R 19/003; G01R 19/0038; H02M 1/00; H02M 1/0003;

(Continued)

(56) References Cited

U.S. PATENT DOCUMENTS 5,892,450 A     4/1999   Scoones et al.
7,764,526 B1    7/2010   Xing et al.
(Continued)

FOREIGN PATENT DOCUMENTS

CN      102812626 B  * 11/2015  .......... H02M 3/1588
CN      205987461 U  *  2/2017  ............. H05B 33/08
(Continued)

OTHER PUBLICATIONS

International Search Report for PCT/US2018/000233 mailed Dec. 20, 2018.

*Primary Examiner* — Hoai-An D. Nguyen
(74) *Attorney, Agent, or Firm* — Frank D. Cimino

(57) ABSTRACT

In one example, an apparatus comprises: a first transistor coupled between a power terminal and a switching terminal; a second transistor coupled between the power terminal and a first sense terminal; a third transistor coupled between the switching terminal and a ground terminal; a fourth transistor coupled between a second sense terminal and the ground terminal; a first variable current source coupled to the first sense terminal; a second variable current source coupled to the second sense terminal; a processing circuit having first, second, third, and fourth inputs and first and second outputs, the first input coupled to the switching terminal, the second input coupled to the first sense terminal, the third input coupled to the ground terminal, the fourth input coupled to the second sense terminal, the first output coupled to the first variable current source, and the second output coupled to the second variable current source.

26 Claims, 11 Drawing Sheets

(58) Field of Classification Search
CPC ........ H02M 1/0009; H02M 3/00; H02M 3/02; H02M 3/04; H02M 3/06; H02M 3/07; H02M 3/10; H02M 3/145; H02M 3/155; H02M 3/156; H02M 3/158
USPC .......................................... 324/76.11, 140 R
See application file for complete search history.

(56) References Cited

U.S. PATENT DOCUMENTS

| | | | |
|---|---|---|---|
| 9,083,230 | B2 | 7/2015 | Narimani et al. |
| 9,160,232 | B2 | 10/2015 | Thomas et al. |
| 9,325,252 | B2 | 4/2016 | Narimani et al. |
| 9,520,800 | B2 | 12/2016 | Tian et al. |
| 9,559,541 | B2 | 1/2017 | Cheng et al. |
| 9,590,613 | B2 * | 3/2017 | Mednik ................... H02M 1/08 |
| 9,748,862 | B2 | 8/2017 | Cheng et al. |
| 9,806,604 | B2 | 10/2017 | Delos Ayllon et al. |
| 9,866,113 | B1 | 1/2018 | Assaad et al. |
| 9,929,653 | B1 | 3/2018 | Mercer et al. |
| 10,050,515 | B1 | 8/2018 | Chakraborty et al. |
| 10,090,763 | B1 | 10/2018 | Mercer et al. |
| 10,193,437 | B1 * | 1/2019 | Hari ...................... H02M 7/217 |
| 11,611,320 | B2 * | 3/2023 | Stanescu ............. H03F 3/45632 |
| 2010/0253313 | A1 | 10/2010 | Herzer et al. |
| 2010/0308784 | A1 | 12/2010 | Scoones et al. |
| 2011/0018511 | A1 | 1/2011 | Carpenter et al. |
| 2011/0199057 | A1 | 8/2011 | Ivanov et al. |
| 2011/0235831 | A1 | 9/2011 | Kaiho et al. |
| 2011/0316503 | A1 | 12/2011 | Huang |
| 2012/0098512 | A1 | 1/2012 | Kirchner |
| 2013/0334987 | A1 | 12/2013 | Garg et al. |
| 2014/0232364 | A1 | 8/2014 | Thomas et al. |
| 2014/0266099 | A1 | 9/2014 | Ku et al. |
| 2015/0194902 | A1 | 7/2015 | Tian et al. |
| 2015/0207401 | A1 | 7/2015 | Zhang et al. |
| 2015/0340952 | A1 | 11/2015 | Manohar et al. |
| 2016/0013713 | A1 | 1/2016 | Li et al. |
| 2016/0118886 | A1 | 4/2016 | Zhang et al. |
| 2016/0254745 | A1 | 9/2016 | Lim et al. |
| 2016/0254746 | A1 | 9/2016 | Lerdworatawee |
| 2016/0299554 | A1 | 10/2016 | Kumar |
| 2016/0301303 | A1 | 10/2016 | Bari et al. |
| 2016/0315539 | A1 | 10/2016 | Lee et al. |
| 2016/0373002 | A1 | 12/2016 | Borfigat et al. |
| 2017/0126120 | A1 | 5/2017 | Chakraborty et al. |
| 2017/0149335 | A1 | 5/2017 | Morroni |
| 2017/0256950 | A1 | 9/2017 | Kuai |
| 2018/0006552 | A1 | 1/2018 | Delos Ayllon et al. |
| 2018/0006559 | A1 | 1/2018 | Chen et al. |
| 2018/0034364 | A1 | 2/2018 | Nakada et al. |
| 2018/0294717 | A1 | 10/2018 | Zhang et al. |
| 2022/0247372 | A1 * | 8/2022 | Xu ...................... H03F 3/45995 |

FOREIGN PATENT DOCUMENTS

| | | | | |
|---|---|---|---|---|
| CN | 208174829 | U | * 11/2018 | ............. H04N 5/225 |
| CN | 106655445 | B | * 3/2020 | ................ H02J 7/35 |
| WO | WO-2022227070 | A1 | * 11/2022 | .......... H02M 1/0058 |

* cited by examiner

CURRENT SENSING FOR POWER CONVERTER

CROSS-REFERENCE TO RELATED APPLICATION

This application claims priority to, and the benefit of, U.S. Provisional Patent Application No. 63/325,842, entitled "Average Current Sensing," filed Mar. 31, 2022, the entirety of which is hereby incorporated by reference.

BACKGROUND

High efficiency power supplies are desirable for a variety of systems, such as for battery-operated systems including mobile phones, tablets, laptops and other user devices. A power supply system may include a power conversion circuit to regulate or control a voltage provided to the load. Such system may also regulate/control an amount of current provided to the load.

SUMMARY

In one example, an apparatus is provided. The apparatus comprises a first transistor, a second transistor, a third transistor, a fourth transistor, a first variable current source, a second variable current source, a first comparator, a second comparator, and a processing circuit. The first transistor is coupled between a power terminal and a switching terminal, the first transistor having a first control terminal. The second transistor is coupled between the power terminal and a first sense terminal, the second transistor having a second control terminal coupled to the first control terminal. The third transistor is coupled between the switching terminal and a ground terminal, the third transistor having a third control terminal. The fourth transistor coupled between a second sense terminal and the ground terminal, the fourth transistor having a fourth control terminal coupled to the third control terminal. The first variable current source is coupled to the first sense terminal, the first variable current source having a first current control terminal. The second variable current source is coupled to the second sense terminal, the second variable current source having a second current control terminal. The first comparator has first comparator inputs and a first comparator output, a first one of the first comparator inputs coupled to the first sense terminal, and a second one of the first comparator inputs coupled to the switching terminal. The second comparator has second comparator inputs and a second comparator output, a first one of the second comparator inputs coupled to the second sense terminal, and a second one of the second comparator inputs coupled to the ground terminal. The processing circuit has first and second processing inputs, first and second bias outputs, and a processing output, the first processing input coupled to the first comparator output, the second processing input coupled to the second comparator output, the first bias output coupled to the first current control terminal, and the second bias output coupled to the second current control terminal.

In one example, an apparatus is provided. The apparatus comprises a first transistor, a second transistor, a third transistor, a fourth transistor, a first variable current source, a second variable current source, a first comparator, a second comparator, a processing circuit, and a control signal generator. The first transistor is coupled between a power terminal and a switching terminal, the first transistor having a first control terminal. The second transistor is coupled between the power terminal and a first sense terminal, the second transistor having a second control terminal coupled to the first control terminal. The third transistor is coupled between the switching terminal and a ground terminal, the third transistor having a third control terminal. The fourth transistor coupled between a second sense terminal and the ground terminal, the fourth transistor having a fourth control terminal coupled to the third control terminal. The first variable current source is coupled to the first sense terminal, the first variable current source having a first current control terminal. The second variable current source is coupled to the second sense terminal, the second variable current source having a second current control terminal. The first comparator has first comparator inputs and a first comparator output, a first one of the first comparator inputs coupled to the first sense terminal, and a second one of the first comparator inputs coupled to the switching terminal. The second comparator has second comparator inputs and a second comparator output, a first one of the second comparator inputs coupled to the second sense terminal, and a second one of the second comparator inputs coupled to the ground terminal. The processing circuit has first and second processing inputs, first and second bias outputs, and a processing output, the first processing input coupled to the first comparator output, the second processing input coupled to the second comparator output, the first bias output coupled to the first current control terminal, and the second bias output coupled to the second current control terminal. The control signal generator has a control input and first and second control outputs, the control input coupled to the processing output, the first control output coupled to the first control terminal, and the second control output coupled to the third control terminal.

In one example, a method is provided. The method comprises comparing a current of a power converter with a measurement current during on-time and off-time of the power converter. The method further comprises responsive to the current exceeding the measurement current, increasing the measurement current. The method further comprises responsive to the current being less than the measurement current, reducing the measurement current. And the method further comprises providing a signal based on the measurement current, in which the signal represents an average of the current.

BRIEF DESCRIPTION OF THE DRAWINGS

In the drawings, like reference numerals refer to like elements throughout, and the various features are not necessarily drawn to scale.

DETAILED DESCRIPTION

The present disclosure describes examples of a measurement circuit that can provide a signal representing an average current in the inductor of a switch mode power converter. The average current signal provided by the measurement circuit can have various applications, such as average current limit, adding or shedding phases in a multiphase power converter, entering different modes of operation at different power levels, telemetry (reporting the current via an analog-to-digital converter (ADC)), and phase balancing in a multiphase power converter, all of which can facilitate regulation and/or control of the inductor current and hence an amount of power transferred by the power converter.

Figure 1A:
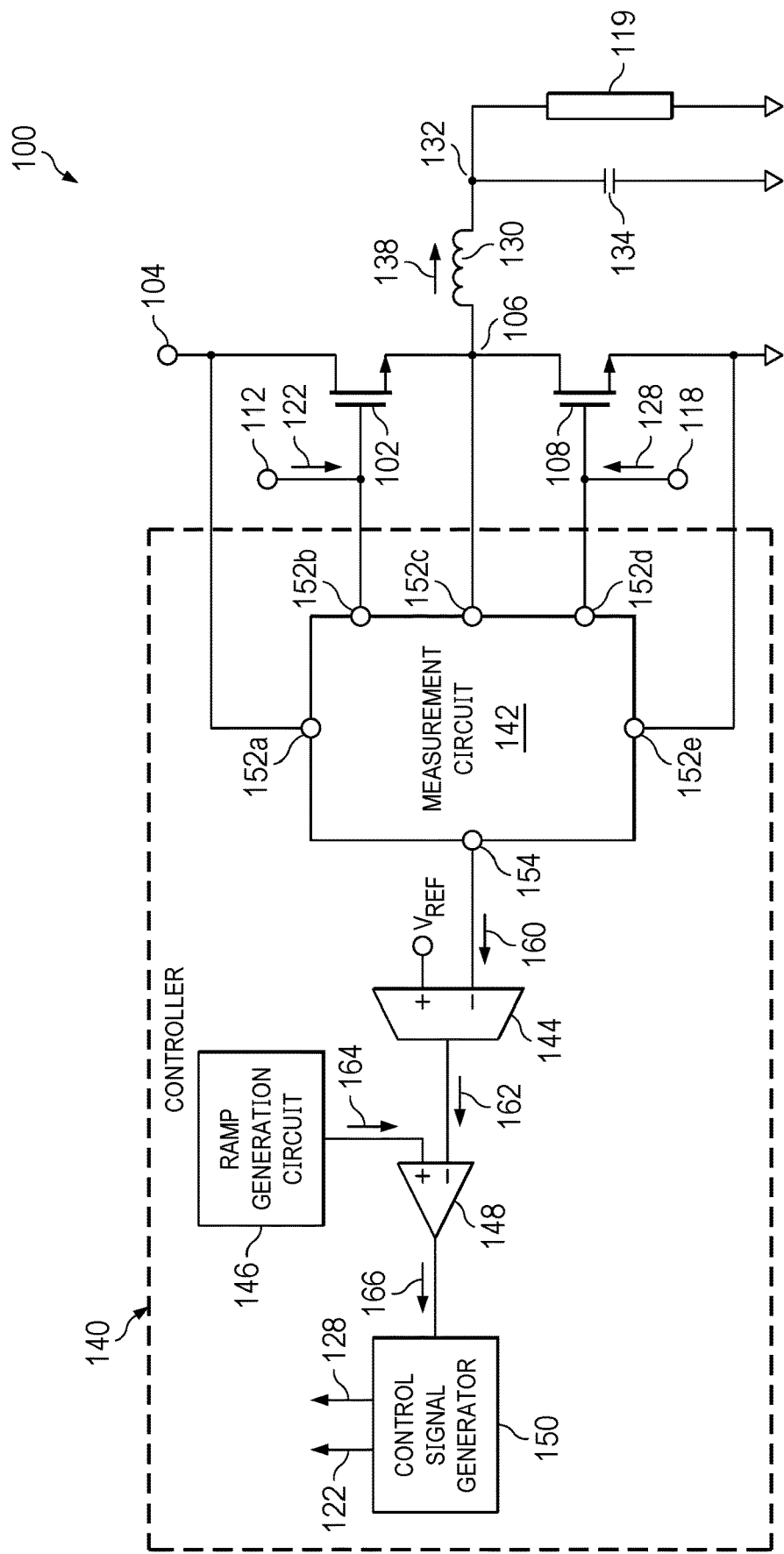
FIGS. 1A, 1B, and 1C are schematics illustrating examples of a power conversion system including an average current measurement circuit.
Figure 1B:
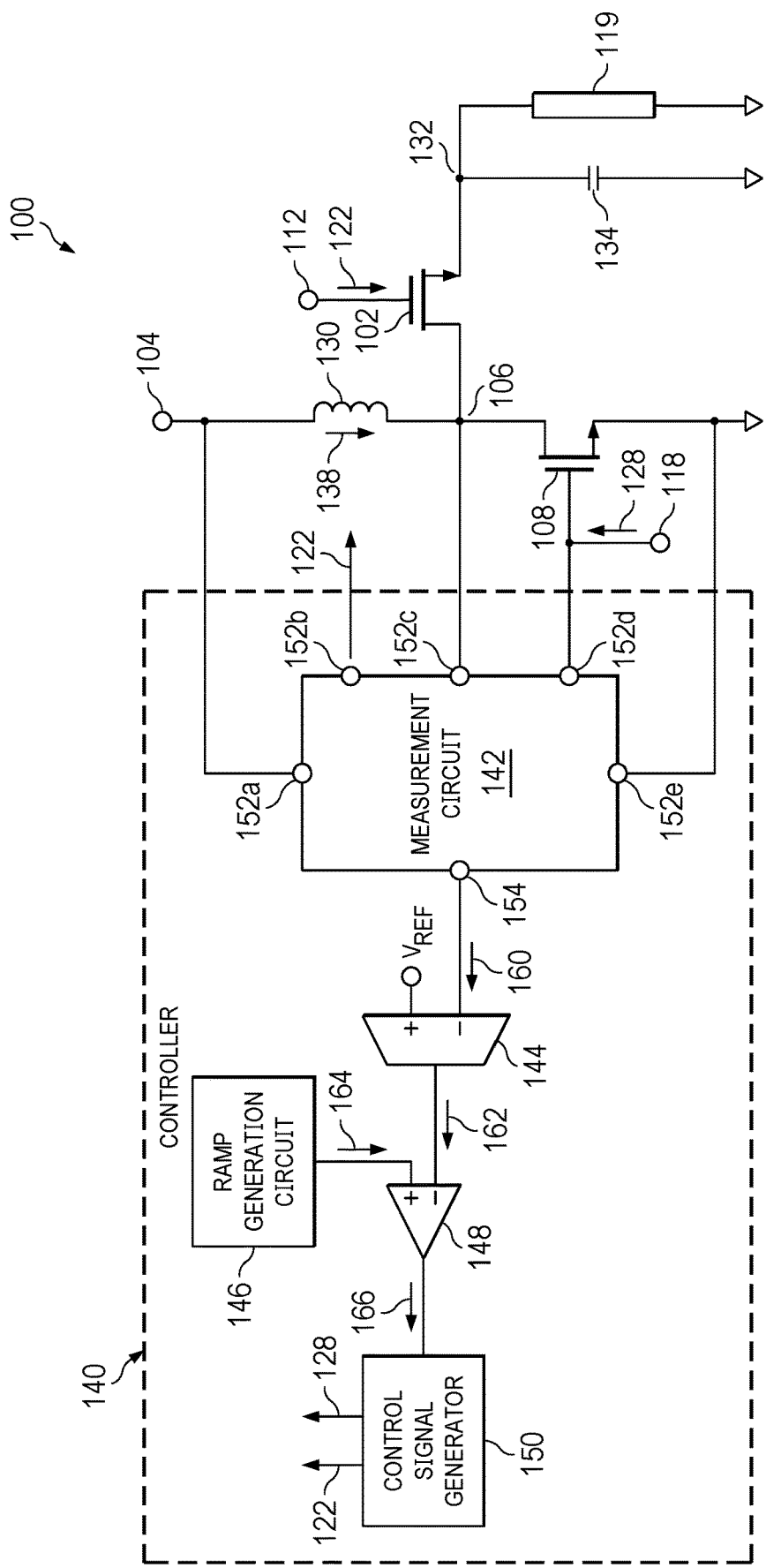
Figure 1C:
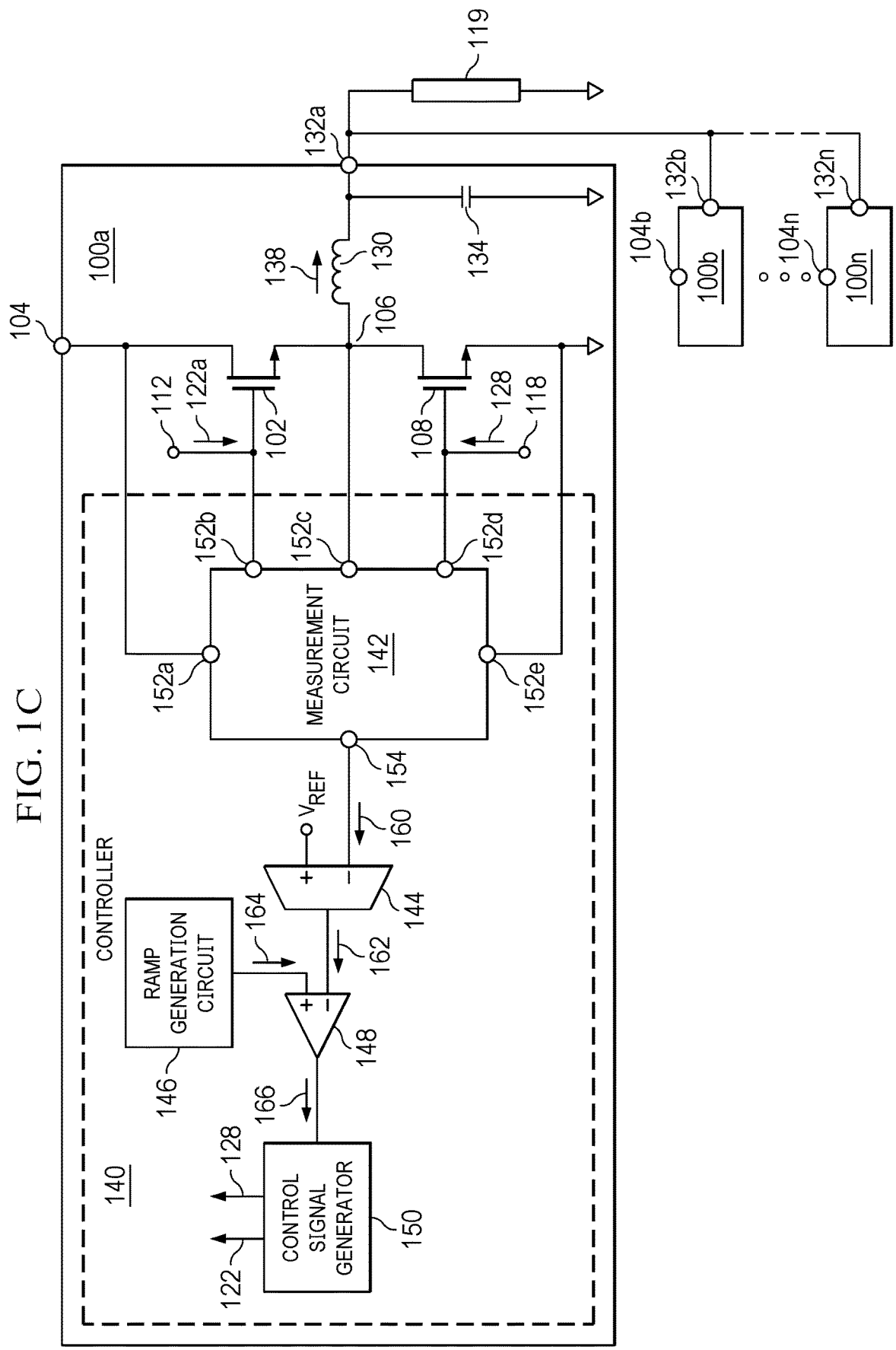

FIG. 1A, FIG. 1B, and FIG. 1C illustrate examples of a power converter 100. Referring to FIG. 1A, power converter 100 can include a transistor 102 coupled between a power input 104 and a switching terminal 106, and a transistor 108 coupled between switching terminal 106 and a ground terminal. A power source (not shown in FIG. 1) can be coupled to power input 104 to provide a voltage and a current at power input 104.

Each of transistors 102 and 108 can include various types of transistors, such as silicon field effect transistors (FET), gallium nitride (GaN) high electron mobility transistors (HEMT). In the example shown in FIG. 1, each of transistors 102 and 108 can include one or more n-channel FETs (NFETs). Transistor 102 can include a control terminal 112 to receive a control signal 122 that can enable or disable transistor 102. Also, transistor 108 can include a control terminal 118 to receive control signal 128 that can enable or disable transistor 108. Power converter 100 also includes an inductor 130 coupled between switching terminal 106 and a power output 132, and a capacitor 134 coupled between power output 132 and ground.

The example power converter 100 of FIG. 1A is a buck converter. In some examples, as shown in FIG. 1B, power converter 100 can be boost converter, and inductor 130 can be swapped with transistor 102 compared with FIG. 1A. In some examples (not shown in the figures), power converter 100 can be a buck-boost converter, and inductor 130 can be swapped with transistor 108 for an inverting buck-boost converter, or an additional pair of transistors (e.g., FETs) coupled between inductor 130 and output 132 for a non-inverting buck-boost converter.

Figure 2:
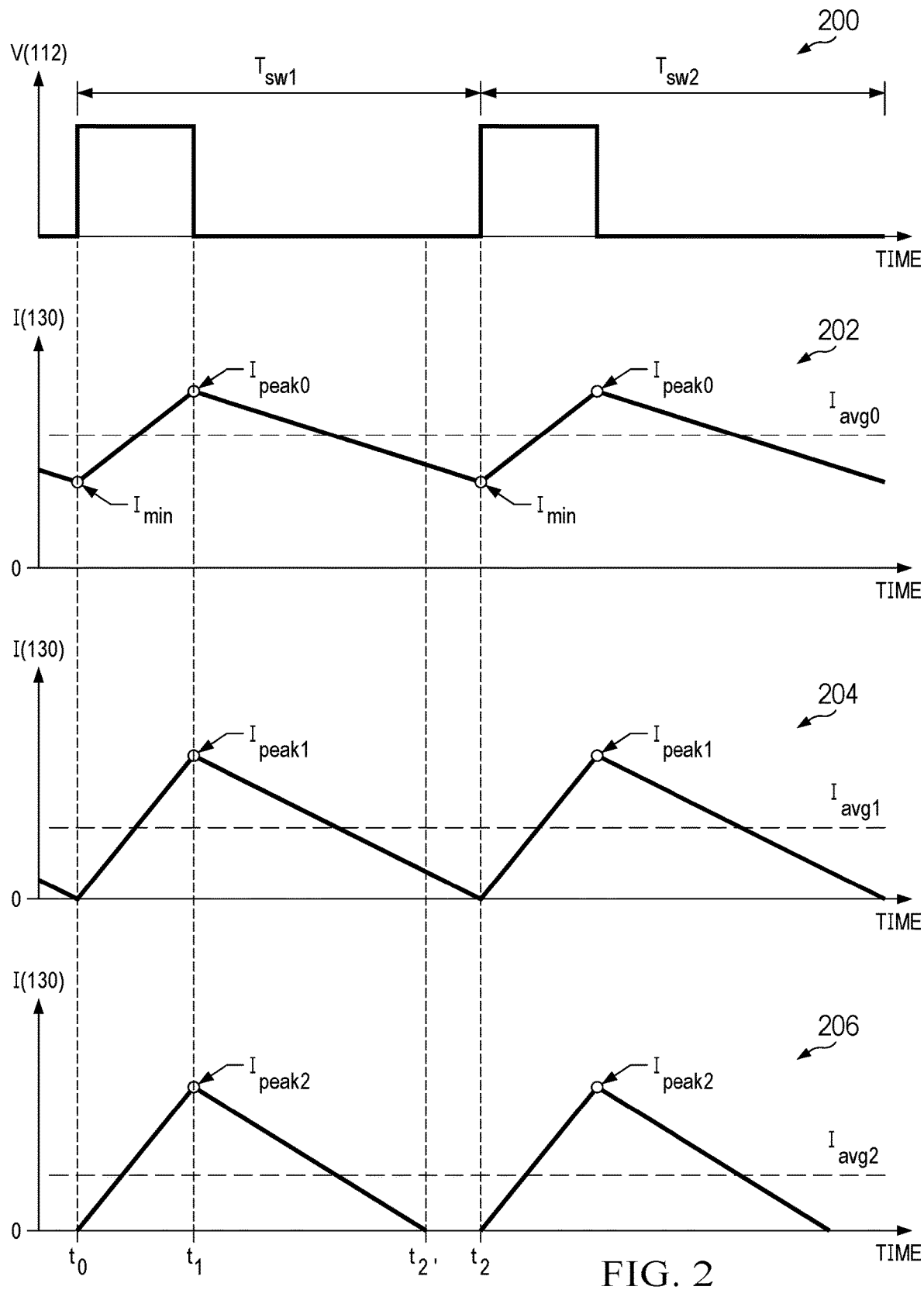
FIG. 2 includes graphs representing example operations of the power conversion system of FIG. 1A.

Through the switching of transistors 102 and 108, power converter 100 can provide a current 138 through inductor 130 to power output 132 to charge capacitor 134 and/or to a load 119. Power converter 100 can also control the flow of current 138 in various modes, such as a continuous conduction mode (CCM), a critical conduction mode (CrCM), and a discontinuous conduction mode (DCM). FIG. 2 includes graphs 200, 202, 204, and 206 that illustrate example operations of power converter 100. Graph 200 represents an example variation of control signal 122 (labelled V(112)) with time. Graph 202 represents an example variation of current 138 through inductor 130 (labelled I(130)) with time in CCM. Graph 204 represents an example variation of current 138 through inductor 130 (labelled I(130)) with time in CrCM. And graph 206 represents an example variation of current 138 through inductor 130 (labelled I(130)) with time in DCM.

Specifically, within a first interval between $t_0$ and $t_1$ in a first switching cycle (labelled $T_{SW1}$), control signal 122 can have a high state, and transistor 102 is enabled. Transistor 108 is also disabled between $t_0$ and $t_1$. The first interval can represent an on-time of power converter 100. Within the first interval, power input 104 can be electrically connected to switching terminal 106, and the power source can provide current 138 to charge inductor 130. Current 138 can ramp up as inductor 130 stores magnetic energy, and the current reaches a peak at the end of the first interval. Referring to graph 202, in CCM, current 138 can ramp from a non-zero minimum value $I_{min}$ at $t_0$ to a peak value $I_{peak0}$ at $t_1$. Also, referring to graphs 204 and 206, in CrCM and DCM, current 138 can ramp from a zero value at $t_0$ to respective peak values $I_{peak1}$ and $I_{peak2}$ at $t_1$.

Also, within a second interval between $t_1$ and $t_2$ in the switching cycle, control signal 122 can have a low state, and transistor 102 is disabled. The second interval can represent an off-time of power converter 100. Within the second interval, transistor 108 can be enabled, power input 104 can be disconnected from switching terminal 106, switching terminal 106 can electrically connected to ground. Current 138 can ramp down from the peak value as inductor 130 releases the magnetic energy. In CCM, current 138 can ramp down to the non-zero minimum value $I_{min}$ at $t_2$. In CrCM, current 138 can ramp down to the zero value at $t_2$. Also, in DCM, current 138 can ramp down to the zero value at t2' before the end of the switching cycle, and the inductor current can be zero for the remainder of the switching cycle between $t_2'$ and $t_2$. The average inductor currents in CCM, CrCM, and DCM are labelled as, respectively, $I_{avg0}$, $I_{avg1}$, and $I_{avg2}$. The next switching cycle (labelled $T_{SW2}$) can then start at $t_2$.

Through controlling the relative durations of the on-time and off-time of a switching cycle (e.g., based on the duty cycles of control signals 122 and 128, or the duration of one of the first/second intervals), power converter 100 can set the minimum inductor current, peak inductor current, and average inductor current. Also, power converter 100 can set a ratio between an output voltage at power output 132 and an input voltage at power input 104 based on the duty cycles of control signals 122 and 128.

Referring again to FIG. 1A, power converter 100 also includes a controller 140 to provide multi-cycle control signals 120 and 128 to control the switching of transistors 102 and 108. In the example of FIG. 1A, controller 140 can set the first and second intervals of a switching cycle of control signals 120 and 128 to regulate the average of current 138 to a target average current value. In other examples (not shown in the figures), controller 140 can also set the first and second intervals to regulate the output voltage at power output 132 to a target output voltage.

Specifically, controller 140 can include an average current measurement circuit 142, an error amplifier 144, a ramp generation circuit 146, a comparator 148, and a control signal generator 150. Average current measurement circuit 142 has measurement inputs 152a, 152b, 152c, 152d, and 152e coupled to, respectively, power input 104, control terminal 112, switching terminal 106, control terminal 118, and the ground terminal. Average current measurement circuit 142 also has an output 154. As to be described in details below, average current measurement circuit 142 can provide a signal 160 (e.g., a voltage signal) at output 154 representing a measurement of an average of current 138 across multiple switching cycles. For example, signal 160 can be a voltage signal, and a voltage level of signal 160 can represent an average magnitude of current 138. In some examples, signal 160 can be sampled and converted (e.g., by an ADC) from an analog signal to a digital signal, and the digital signal can provide a digital representation of the average magnitude of current 138.

Also, error amplifier 144 has a first input (e.g., a positive input) coupled to a reference source (not shown in the figures) to receive a reference voltage VREF. Error amplifier 144 also has a second input (e.g., a negative input) coupled to output 154 of average current measurement circuit 142. VREF can represent a target average of current 138. Error amplifier 144 can provide an error signal 162 based on a difference between VREF and signal 160, and error signal 162 can represent a current error.

Further, comparator 148 has a first input (e.g., a positive input) coupled to ramp generation circuit 146, which generates a multi-cycle ramp signal 164 having the same cycle period as a switching cycle of transistors 102 and 108. Comparator 148 also has a second input (e.g., a negative) coupled to the output of error amplifier to receive error signal 162. Comparator 148 can generate a comparison signal 166 representing a comparison between error signal 162 and the periodic ramp signal 164, and provide comparison signal 166 to control signal generator 150. Control signal generator 150 can provide control signals 122 and 128 and set the state of the control signals 122 based on the state of comparison signal 166. In some examples, control signal generator 150 can include a pulse width modulation (PWM) signal generator.

The duration of the comparison signal 166 in different states can reflect the polarity of error signal 162 (whether the average of current 138 is above and below the target) and the size of the current error. Control signal generator 150 can set the durations of the on-time (in which transistor 102 is enabled and transistor 108 is disabled) and off-time (in which transistor 102 is disabled and transistor 108 is enabled) based on the durations of the comparison signal 166 in different states. For example, control signal generator 150 can set the on-time (control signal 122 having a high state and control signal 128 having a low state) responsive to comparison signal 166 indicating that error signal 162 having a higher voltage than ramp signal 164. Control signal generator 150 can also set the off-time (control signal 122 having a low state and control signal 128 having a high state) responsive to comparison signal 166 indicating that error signal 162 having a lower voltage than ramp signal 164. The on-time can represent a pulse width of control signal 122, and the off-time can represent a pulse width of control signal 128. Also, the voltage level of error signal 162 can determine the time it takes for ramp signal 164 to rise above error signal 162. Accordingly, control signal generator 150 can also set the pulse widths of control signals 122 and 128 that reflect the amount of current error, or a target average current.

In some examples, power converter 100 can support multi-phase operations, in which power converter 100 can provide different average current in phases. The multi-phase operations can be performed to, for example, increase/decrease the average current in phases, performing phase balancing, etc. For example, referring to FIG. 1C, multiple power converters 100, including power converters 100*a*, 100*b*, . . . 100*n*, can be coupled to load 119. Power converter 100*a* can have a power input 104*a* and a power output 132*a*, power converter 100*b* can have a power input 104*b* and a power output 132*b*, and power converter 100*n* can have a power input 104*n* and a power output 132*n*. Power inputs 104*a*-*n* can be coupled to a single power source, or each power input can be coupled to a respective power source. Power outputs 132*a*-*n* are coupled to load 119.

In some examples, each of power converters 100*a*-*n* can include the same components as power converter 100 of FIG. 1A, including controller 140 (which includes measurement circuit 142, error amplifier 144, comparator 148, control signal generator 150, etc.), transistors 102 and 108, inductor 130, and capacitor 134. Each power converter can supply power (voltage and current) to load 119. In some examples, each of power converters 100*a*-*n* can operate independently as a separate converter. In some examples, each of power converters 100*a*-*n* can include certain components of power converter 100 of FIG. 1A and share other components. For example, each of power converters 100*a*-*n* can include transistors 102 and 108, inductor 130, and measurement circuit 142, and power converters 100*a*-*n* can share a capacitor 134, an error amplifier 144, a comparator 148, a ramp generation circuit 146, and a control signal generator 150.

In a first phase of the multiphase operations, controller 140 of power converter 100*a* can be enabled, and controller 140 of power converters 100*b*-*n* can be disabled. The average current measurement circuit 142 of controller 140 can generate signal 160 representing an average of current 138 through transistors 102 and 108 and inductor 130 of power converter 100*a*, and controller 140 can generate active control signals 122 and 128 to enable/disable switches 102*a* and 108*a*, and set the duty cycles of control signals 122 and 128 to reduce a difference between the average of current 138 through transistors 102 and 108 and a target average current represented by VREF. After the target average current is reached, controller 140 of additional power converters (e.g., power converters 100*b*, 100*n*, etc.) can be enabled in subsequent phases to provide additional current 138 to load 119 in increments, with each current increment added by a particular power converter regulated by measuring the average of current 138 provided by that power converter.

Figure 3:
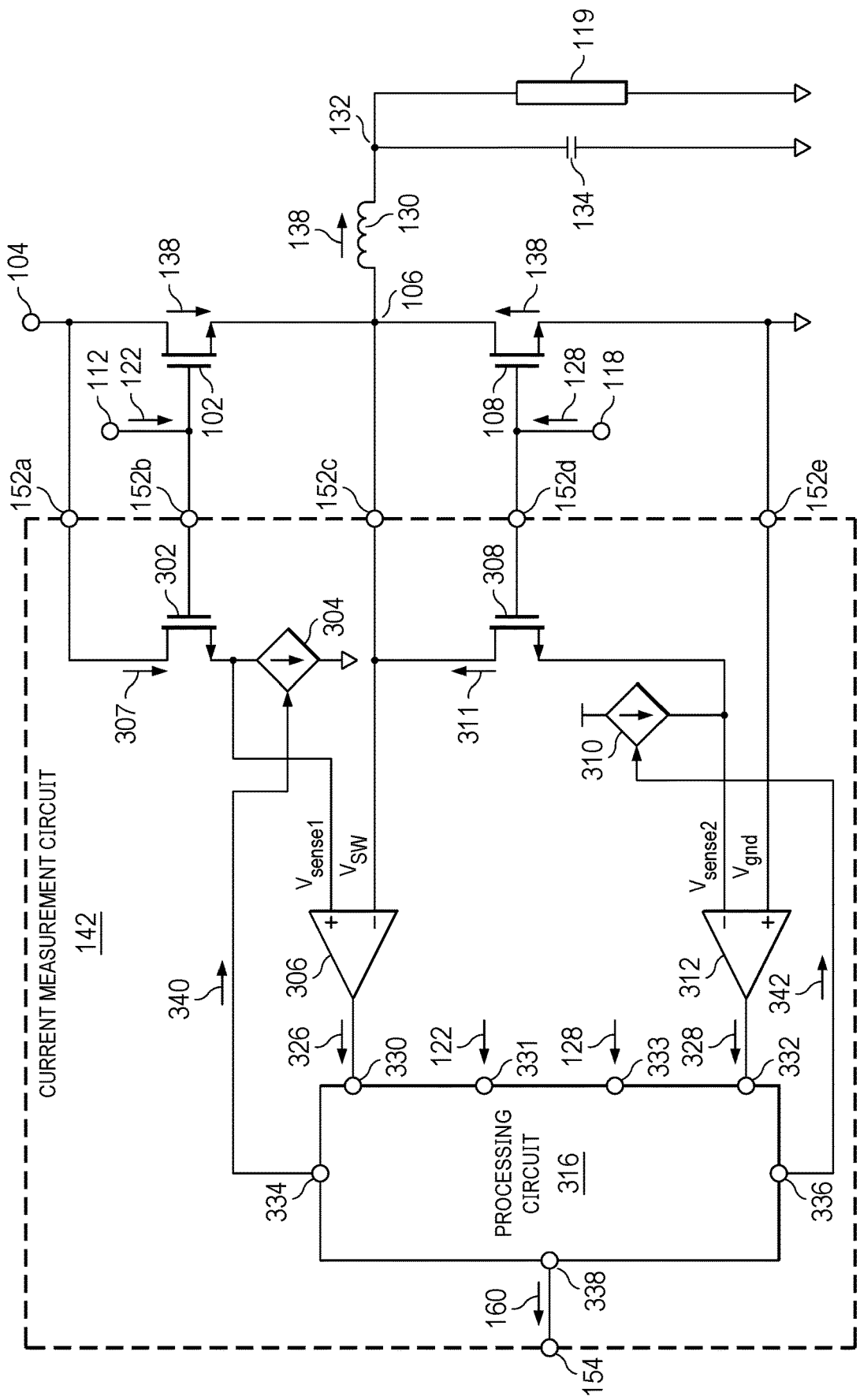
FIG. 3 and FIG. 4 are schematics illustrating example internal components of the average current measurement circuit of FIGS. 1A and 1B.

FIG. 3 illustrates examples of internal components of average current measurement circuit 142. As shown in FIG. 3, average current measurement circuit 142 can include a sense transistor 302, a variable current source 304, and a comparator 306 to measure current 138 during the on-time of power converter 100 by comparing the current 138 through transistor 102 with a measurement current 307 provided by variable current source 304. Also, average current measurement circuit 142 can include a sense transistor 308, a variable current source 310, and a comparator 312 to measure current 138 during the off-time of power converter 100 by comparing the current 138 through transistor 108 with a measurement current 311 provided by variable current source 310. Measurement currents 307 and 311 can have the same magnitude. In some examples, sense transistors 302 and 308 and comparators 306 and 312 can be part of power converter 100 to support other operations, such as current limiting operations, and can be repurposed as part of average current measurement circuit 142 to provide average current measurement. Such arrangements can reduce/eliminate the need for additional sense elements for sensing current, which can reduce die size and cost.

Also, average current measurement circuit 142 includes a processing circuit 316 coupled to the outputs of comparators 306 and 312 and the control inputs of variable current sources 304 and 310. In some examples, processing circuit 316 can include comparators 306 and 312 or perform the functions of the comparators. Processing circuit 316 can control variable current sources 304 and 310 to adjust the measurement current based on a result of comparison between current 138 and the measurement current. Processing circuit 316 can also provide signal 160 at output 154 of average current measurement circuit 142 representing the measurement current, and signal 160 increases and decreases with the measurement current. As the adjusted measurement current converges around the average of current 138, signal 160 can reach steady state and can represent the average of current 138.

Specifically, sense transistor 302 is coupled between input 152a (coupled to power input 104) and a first input of comparator 312. Variable current source 304 is also coupled between the first input of comparator 312 and the ground, and the measurement current 307 provided by variable current source 304 flows through sense transistor 302, which causes a voltage drop across transistor 302 with respect to the voltage at power input 104 and generates a voltage $V_{sense1}$ at the first input of comparator 306. Also, current 138 flows through transistor 102 during the on-time of power converter 100. The current causes a voltage drop across transistor 102 with respect to the voltage at power input 104 and generates a voltage $V_{SW}$ at the second input of comparator 306. Also, the control terminal of sense transistor 302 is coupled to input 152b and control terminal 112 of transistor 102 and can receive control signal 122. Transistor 302 can have a width that is 1/N of transistor 102, and can have a resistance that is N times of transistor 102 due to both transistors having the same control terminal (gate) voltage. Accordingly, if measurement current 307 matches 1/N of current 138, the voltage drops across transistors 302 and 102 can be the same, and $V_{sense1}$ can be equal to $V_{SW}$. On the other hand, $V_{sense1}$ higher than $V_{SW}$ can indicate that measurement current 307 is lower than 1/N of current 138, and $V_{sense1}$ lower than $V_{SW}$ can indicate that measurement current 307 is higher than 1/N of current 138. Comparator 306 can generate a comparison signal 326 representing a result of comparison between $V_{sense1}$ and $V_{SW}$.

Also, sense transistor 308 is coupled between input 152c (coupled to switching terminal 106) and a first input of comparator 312. Variable current source 310 is also coupled between the first input of comparator 312 and a power supply terminal (e.g., VCC), and the measurement current 311 provided by variable current source 310 flows through sense transistor 308, which causes a voltage drop across transistor 308 with respect to $V_{SW}$ and generates a voltage $V_{sense2}$ at the first input of comparator 312. Also, current 138 flows through transistor 108 during the off-time of power converter 100. The current causes a voltage drop across transistor 108 with respect to and generates a voltage $V_{gnd}$ at the second input of comparator 306. Also, the control terminal of sense transistor 308 is coupled to input 152d and control terminal 118 of transistor 108 and can receive control signal 128. Transistor 308 can have a width that is 1/N of transistor 108, and can have a resistance that is N times of transistor 108 due to both transistors having the same control terminal (gate) voltage. Accordingly, if measurement current 311 matches 1/N of current 138, the voltage drops across transistors 308 and 108 can be the same, and $V_{sense2}$ can be equal to $V_{gnd}$. On the other hand, $V_{sense2}$ higher than $V_{gnd}$ can indicate that measurement current 311 is higher than 1/N of current 138, and $V_{sense2}$ lower than $V_{gnd}$ can indicate that measurement current 311 is higher than 1/N of current 138. Comparator 312 can generate a comparison signal 328 representing a result of comparison between $V_{sense2}$ and $V_{gnd}$.

Processing circuit 316 has control inputs 330, 331, 332, and 333, bias outputs 334 and 336, and a control output 338. Control inputs 330 and 332 are coupled to, respectively, the outputs of comparators 306 and 312. Control input 331 is coupled to input 152b to receive control signal 122. Control input 333 is coupled to input 333 to receive control signal 128. Bias output 334 is coupled to variable current source 304, and bias output 336 is coupled to variable current source 310. Control output 338 is coupled to output 154. Processing circuit 316 can generate a bias voltage signal 340 at bias output 334 for variable current source 304 to set measurement current 307. Processing circuit 316 can also generate a bias voltage signal 342 at bias output 336 for variable current source 310 to set measurement current 311. Also, processing circuit 316 can receive comparison signals 326 and 328 at, respectively, control inputs 330 and 332, and adjust bias voltage signals 340 and 342 responsive to comparison signals 326 and 328. Specifically, if comparison signal 326 indicates that current 138 is lower than measurement current 307 (during the on-time) or comparison signal 328 indicates that current 138 is lower than measurement current 310 (during the off-time), processing circuit 316 can adjust bias voltage signals 340 and 342 to reduce measurement currents 307 and 311. Also, if comparison signal 326 indicates that current 138 is higher than measurement current 307 (during the on-time) or comparison signal 328 indicates that current 138 is higher than measurement current 310 (during the off-time), processing circuit 316 can adjust bias voltage signals 340 and 342 to increase measurement currents 307 and 311.

As processing circuit 316 repeatedly increases and decreases the measurement currents across multiple switching cycles, in steady state processing circuit 316 can increase and decrease the measurement currents by the same amount in each switching cycle, and the measurement current can converge to or around a value equal to the average of current 138 in the switching cycle. Accordingly, the measurement current 307/311 can provide a measurement of the average of current 138. Processing circuit 316 can provide signal 160 representing measurement current 307/311 at control output 338. For example, processing circuit 316 can provide signal 160 as a voltage signal that tracks bias voltage signals 340/342, and the voltage of signal 160 can represent measurement current 307/311 and an average of current 138.

Figure 4:
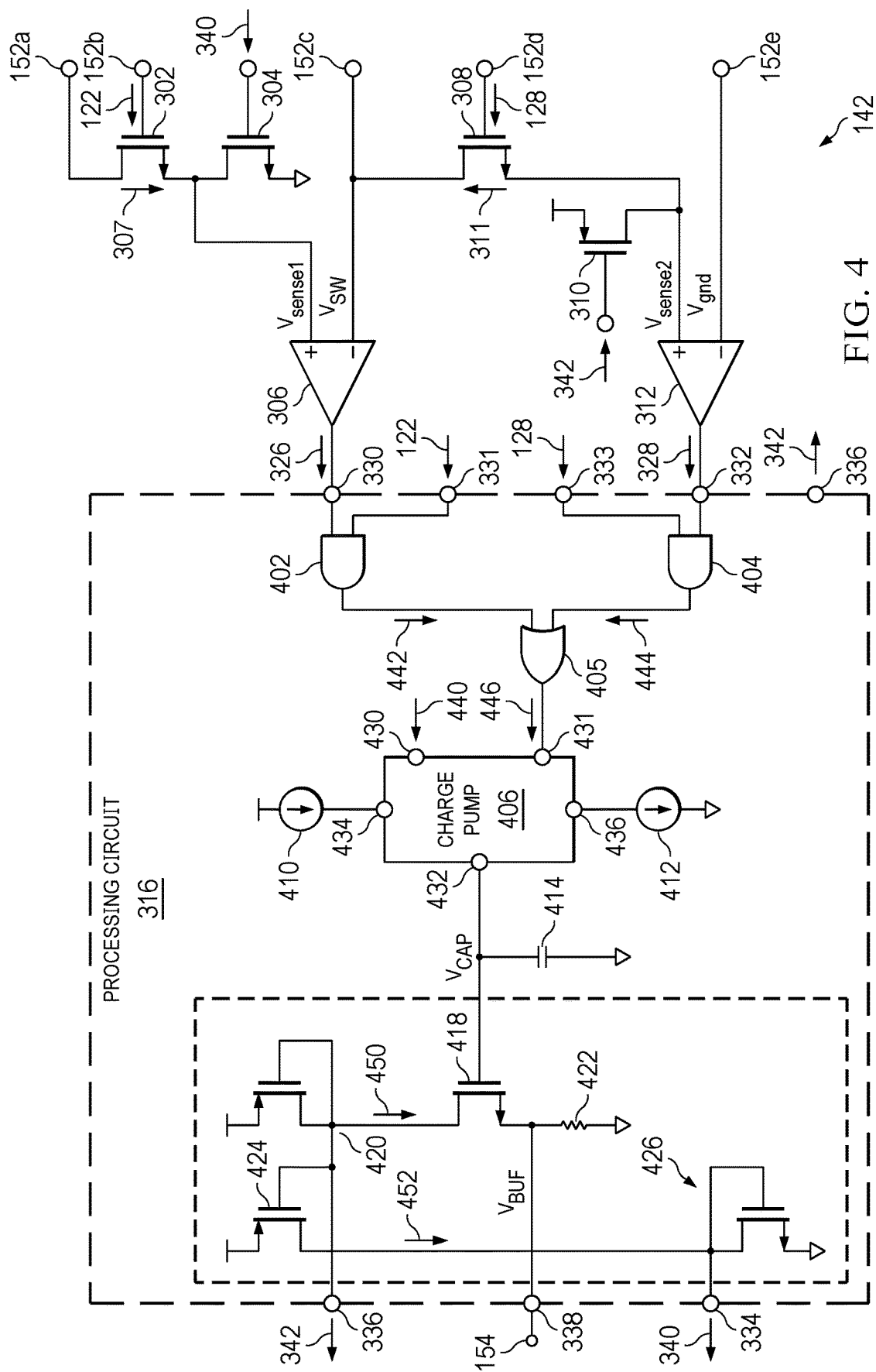

FIG. 4 illustrates example internal components of processing circuit 316. Referring to FIG. 4, processing circuit 316 includes AND logic gates 402 and 404, an OR logic gate, a charge pump circuit 406, current source 410, current sink 412, a capacitor 414, a bias generator circuit 416 including a voltage buffer 418, a diode-connected PFET 420, a resistor 422, a current mirror 424, and a diode-connected NFET 426. Also, variable current source 304 can include an NFET coupled between input 152a and at the first input of comparator 306 to generate the $V_{sense1}$ voltage, and variable current source 310 can include a PFET coupled between input 152e and the first input of comparator 312 to generate the $V_{sense2}$ voltage.

Specifically, charge pump circuit 406 has control inputs 430 and 431, an output 432, and current terminals 434 and 436. Current source 410 is coupled to current terminal 434, and current source 412 is coupled to current terminal 436. Charge pump circuit 406 includes a first switch and a second switch (not shown in FIG. 4), where the first switch is coupled between current terminal 434 and output 432, and the second switch is coupled between output 432 and current terminal 436. The first switch has a control terminal coupled to control input 430, and the second switch has control terminal coupled to control input 431. The control terminal of the first switch is coupled to control input 430, which is coupled to input 152c of average current measurement circuit 142 to receive a control signal 440 generated based on the voltage of switching terminal 106 $V_{SW}$, as to be described below. A terminal of capacitor 414 (e.g., top plate) is coupled to output 432 and has a voltage labelled $V_{CAP}$. Responsive to a state of control input 430, the first switch can connect output 432 to current terminal 434 to charge capacitor 414 and increase the voltage $V_{CAP}$, or disconnect output 432 from current terminal 434. Also, responsive to a state of control input 431, the second switch can connect output 432 to current terminal 436 to discharge capacitor 414 and reduce the voltage $V_{CAP}$, or disconnect output 432 from current terminal 436.

Also, a first input of AND logic gate 402 is coupled to control input 330 to receive comparison signal 326, and a second input of AND logic gate 402 is coupled to control input 331 to receive control signal 122. AND logic gate 402 can provide a signal 442 to represent the state of comparison signal 326 during the on-time of power converter 100 when transistor 102 conducts current 138, and deassert/deactivate signal 442 during the off-time of power converter 100. Also, a first input of AND logic gate 404 is coupled to control input 332 to receive comparison signal 328, and a second input of AND logic gate 404 is coupled to control input 333 to receive control signal 128. AND logic gate 404 can provide a signal 444 to represent the state of comparison signal 328 during the off-time of power converter 100 when transistor 108 conducts current 138, and deassert/deactivate signal 444 during the on-time of power converter 100. The OR logic gate 405 receives signals 442 and 444, and provides control signal 446 to control input 431 of charge pump circuit 406 representing a logical OR between signals 442 and 444. Accordingly, control signal 446 can represent a comparison between current 138 and measurement currents 307/311 throughout the entire switching cycle covering both the on-time and the off-time of power converter 100.

In some examples, charge pump circuit 406 (and the second switch) can discharge capacitor 414 and reduce the voltage $V_{CAP}$ responsive to control signal 446 indicating that current 138 exceeds the measurement current, and stop the discharging responsive control signal 446 indicating that current 138 is below the measurement current. Charge pump circuit 406 can also charge capacitor 414 and increase the voltage $V_{CAP}$ responsive to control signal 440 that tracks $V_{SW}$ at switching terminal 106. The voltage $V_{CAP}$ is increased and decreased repeatedly in multiple switching cycles based on the comparison between current 138 and the measurement current. When the voltage $V_{CAP}$ reaches a steady state where the amounts of voltage increase and decrease are equal in a switching cycle, the voltage $V_{CAP}$ can converge to a particular voltage, and that voltage can represent a measurement of an average of current 138.

Also, as discussed above, the measurement current is also adjusted based on the comparison between current 138 and the measurement current. Such arrangements can facilitate the convergence of $V_{CAP}$ to the value that represents the average of current 138 by reducing the amount of voltage increase and decrease (voltage ripples) in a switch cycle. Bias generator circuit 416 can perform the adjustment of the measurement current. Specifically, bias generator circuit 416 includes diode-connected PFET 420 coupled between a power supply terminal (e.g., VCC) and a current terminal of voltage buffer 418. The input of voltage buffer 418 is coupled to capacitor 414 and output 432 of charge pump circuit 406 to receive $V_{CAP}$, and the output of voltage buffer 418 is coupled to resistor 422. Voltage buffer 418 can provide a voltage $V_{BUF}$ across resistor 422 that is a buffered version of $V_{CAP}$. The voltage $V_{BUF}$ can also be provided as voltage signal 160 at outputs 338/154. The voltage $V_{BUF}$ and the resistance of resistor 422 can set a bias current 450, and diode-connected PFET 420 can generate bias voltage signal 342 representing bias current 450. Also, current mirror 424 can generate a bias current 452 as a replica of bias current 450, and diode-connected NFET 426 can generate bias voltage signal 340 representing bias current 452. The bias voltage signal 340 can be provided to the control terminal of the NFET of variable current source 304. Also, the bias voltage signal 342 can be provided to the control terminal of the PFET of variable current source 310. As the voltage $V_{BUF}$ tracks $V_{CAP}$, bias voltage signals 340 and 342, as well as measurement current 307/311 provided by the respective variable current sources 304 and 310, also tracks $V_{CAP}$ and can be adjusted based on the comparison between current 138 and the measurement current 307/311, and $V_{BUF}$ can represent an average amplitude of current 138.

Figure 5:
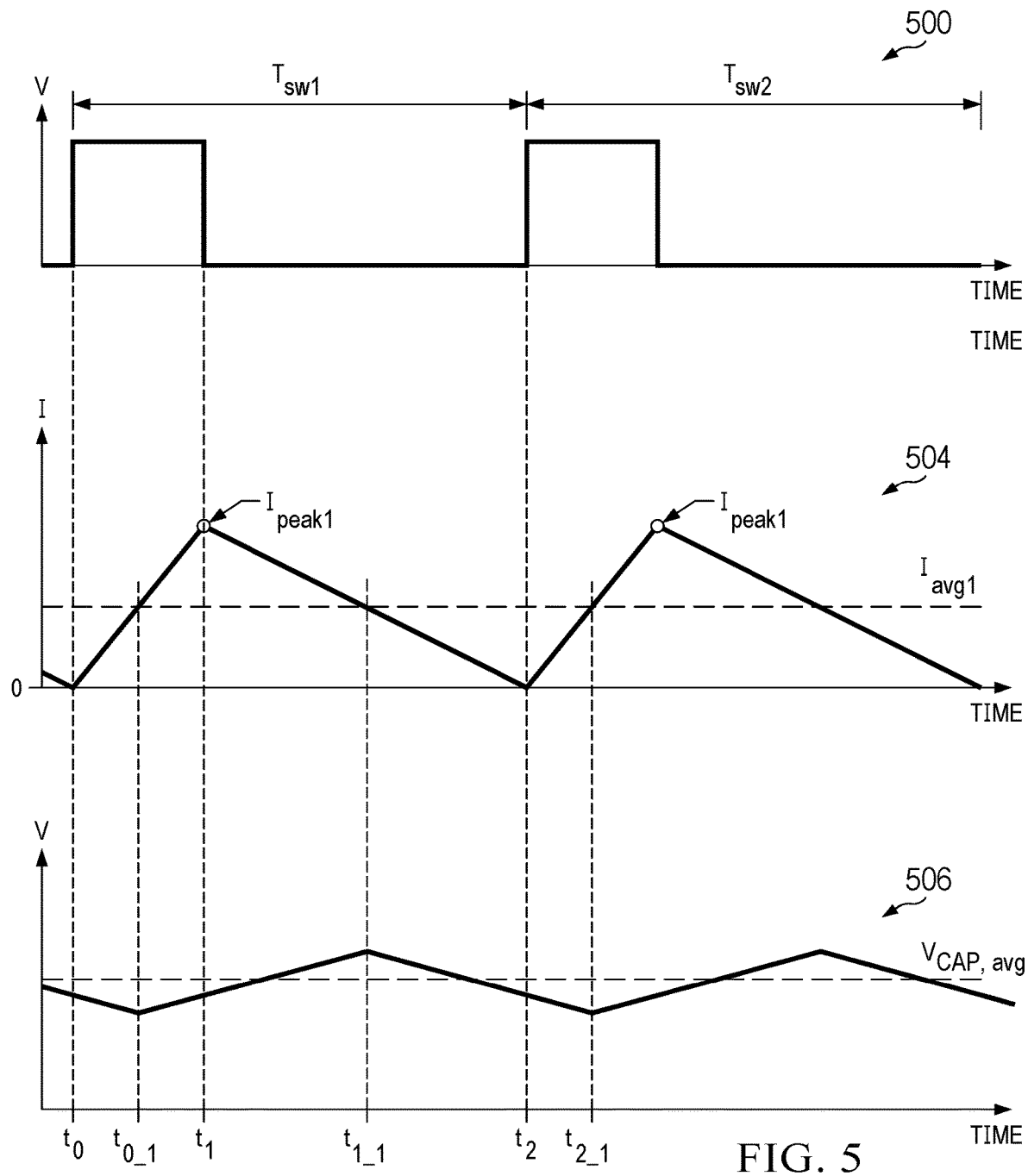
FIG. 5 includes graphs representing example operations of the average current measurement circuit of FIGS. 3 and 4.

FIG. 5 includes graphs 500, 504, and 506 illustrating example operations of processing circuit 316 of FIG. 4. Graph 500 represents an example variation of control signal 122 with time. Graph 504 represents an example variation of current 138 with time in CrCM. Graph 506 represents an example variation of the $V_{CAP}$ voltage with time. In FIG. 5, CrCM operation is shown, but the illustrated operations are applicable for CCM and DCM operations as well.

A first switching cycle (labelled $T_{SW1}$) spans between times t0 and t2, and the second switch cycle (labelled $T_{SW2}$) starts at t2. Within the first switching cycle, the interval between t0 and t1 represents the on-time of power converter 100, in which control signal 122 can have a high state and transistor 102 is enabled, while transistor 108 is disabled. Current 138 increases from zero and reaches Ipeak1 at $t_1$. Also, the interval between $t_1$ and $t_2$ represents the off-time of power converter 100, in which control signal 122 can have a low state and transistor 102 is disabled, while transistor 108 is enabled. Current 138 decreases from $I_{peak1}$ and reaches zero at $t_2$. The average of current 138 is labelled $I_{avg1}$ in FIG. 5, which can be represented by the average of measurement currents 307/311.

Also, within the first switching cycle, between $t_0$ and $t_{0\_1}$ (before the on-time ends), current 138 is below the average of current 138 (and measurement current 307), which can be reflected in comparison signal 326. Responsive to control signal 446 indicating the current 138 is below measurement current 307, charge pump circuit 406 can discharge capacitor 414, and $V_{CAP}$ (and measurement current 307) reduces with time.

Further, between $t_{0\_1}$ and $t_1$, which spans the remainder of the on-time of the first switching cycle, current 138 rises above the average (and measurement current 307) and reaches $I_{peak1}$ at t1. Also, between $t_1$ and $t_{1\_1}$, which spans part of the off-time of the first switching cycle, current 138 falls from $I_{peak}$ but remains above the average (and measurement current 311). According, between $t_{0\_1}$ and $t_{1\_1}$, OR logic gate 405 can provide control signal 446 indicating that the current 138 is above the measurement currents 307/311, charge pump circuit 406 can charge capacitor 414, and $V_{CAP}$ (and measurement currents 307/311) increases with time.

Also, between $t_{1\_1}$ and $t_2$, which spans the remainder of the off-time of the first switching cycle, current 138 continues reducing and becomes lower than the average (and measurement current 311). OR logic gate 405 can switch the state of control signal 446 to indicate that the current 138 is below the measurement current 311, and charge pump circuit 406 can discharge capacitor 414, and $V_{CAP}$ (and measurement currents 311) decreases with time. Also, between $t_2$ and $t_{2\_1}$, which is part of the on-time of the second switching cycle, current 138 increases but remains below the average, and control signal 446 can remain in the state indicating that current 138 is below the average. Charge pump circuit 406 can continue discharging capacitor 414 and reducing $V_{CAP}$ and measurement current 307. Control signal 446 can switch state again at $t_{2\_1}$ responsive to current 138 increasing above the average.

As $V_{CAP}$ increases and decreases repeatedly in each switching cycle of control signal 446, when steady state is reached, the amounts of increase and decrease of $V_{CAP}$ become equal (e.g., control signal 446 reaching 50% duty cycle), and $V_{CAP}$ converges at an average $V_{CAP\_avg}$, which can represent the average of current 138.

In the examples illustrated in FIG. 4 and FIG. 5, the $V_{CAP}$ voltage as well as signal 160 (representing a measurement of average of current 138) may have a duty cycle dependent error. Specifically, the $V_{CAP}$ voltage is adjusted based on comparing current 138 with measurement currents 307/311, which are then adjusted based on the comparison result. Because current 138 depends on the duty cycle of control signal 122, measurement currents 307/311, the result of comparison between current 138 and the measurement currents, and the timing of charging and discharging of capacitor 414, also become duty cycle dependent. That component can introduce an error to the result of measurement of the average current.

The following Equations provide an illustration of the source of duty cycle error. Specifically, referring to FIGS. 5, $t_{0\_1}$ represents a first trip point time where charging of capacitor 414 (and increase of $V_{CAP}$) starts, and $t_{1\_1}$ represents a second trip point time where charging of capacitor 414 (and increase of $V_{CAP}$) ends. Also, $I_L$ represents average of current 138 (through inductor 130), $V_{CAP,avg}$ represents an average of $V_{CAP}$ voltage, $V_{PP}$ represents peak-to-peak ripple voltage of $V_{CAP}$ and is given by $I_{cp}$ (the net charge or discharge current provided by current source 410 and current sink 412) and $C_{cp}$ (capacitance of capacitor 414), and T represents half of switching cycle period. Further, m1 represents the rate of increase of current 138 during the on-time, m2 represents the rate of decrease of current 138 during the off-time, and D represents the duty cycle of control signal 122. Further, it is assumed that a sensed current to voltage ratio of 0.25Ω. These parameters can be related by the following Equations:

$$I_L - \frac{I_{pp}}{2} + m1 \times t_{0\_1} = 4 \times \left(V_{CAP,avg} - \frac{V_{pp}}{2}\right) \quad \text{(Equation 1)}$$

$$I_L + \frac{I_{pp}}{2} - m2 \times (t_{1\_1} - D \cdot T) = 4\left(V_{CAP,avg} + \frac{V_{pp}}{2}\right) \quad \text{(Equation 2)}$$

$$I_{pp} = m1 \times D \times T = m2 \times (1-D) \times T \quad \text{(Equation 3)}$$

$$t_{1\_1} - t_{0\_1} = T/2 \quad \text{(Equation 4)}$$

$$V_{pp} = \frac{I_{cp}}{C_{cp}} \cdot \frac{T}{2} \quad \text{(Equation 5)}$$

$$V_{buf,avg} = I_L \times 0.25\Omega - \frac{V_{pp}}{2} \times \frac{m1-m2}{m1+m2} \quad \text{(Equation 6)}$$

Equation 6 illustrates that $V_{buf,avg}$ (the average of buffered $V_{CAP}$ voltage across resistor 422) has a first component that represents average of current 138 ($I_L$) and a second component $$\frac{V_{pp}}{2} \cdot \frac{m1-m2}{m1+m2}.$$

The second component depends on the duty cycle D and can introduce a duty cycle dependent error component to the result of measurement of the average current.

Figure 6:
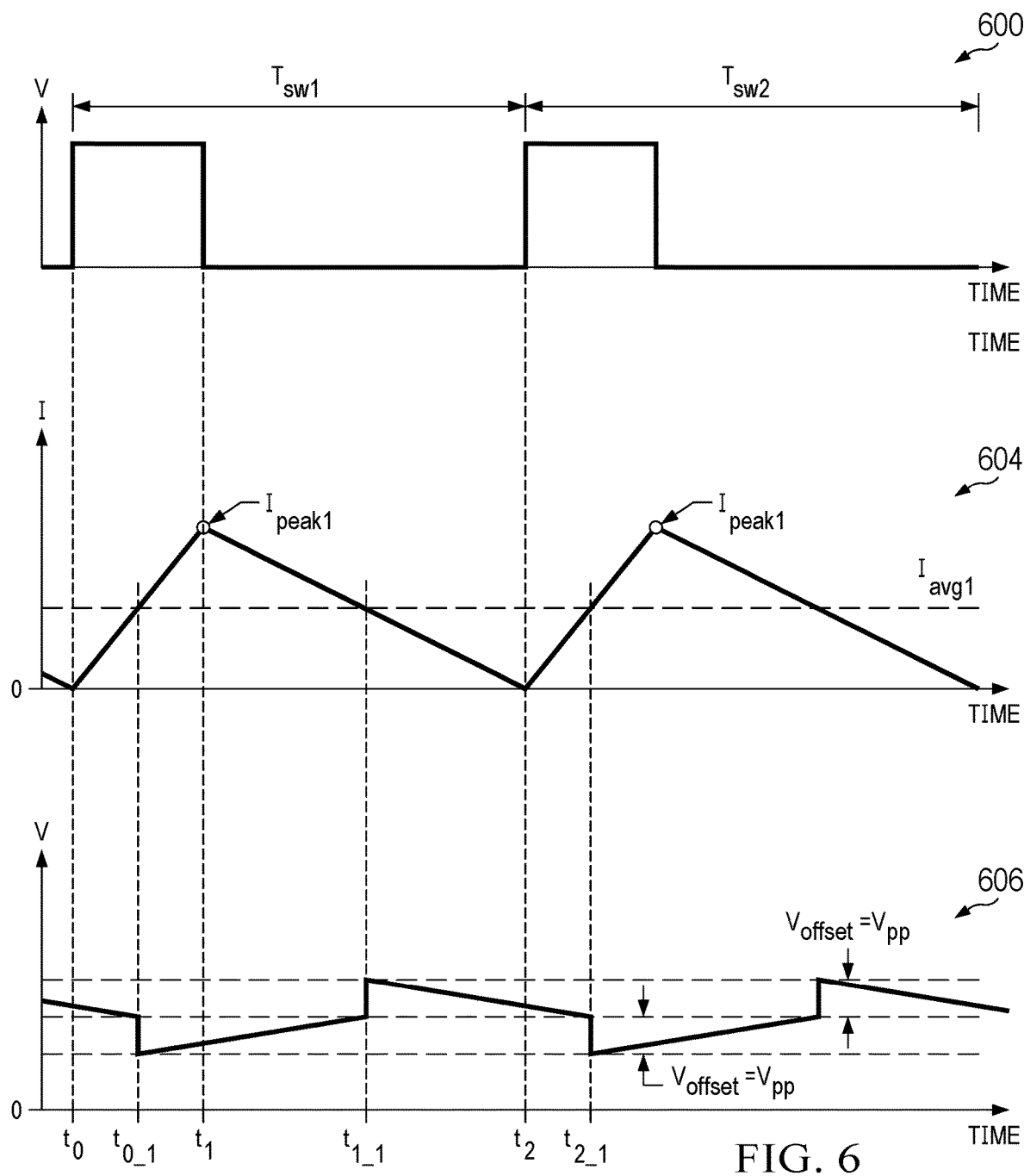
FIG. 6 includes graphs representing example operations of another average current measurement circuit that can be part of FIGS. 3 and 4.

FIG. 6 include graphs that illustrate example techniques to mitigate the duty cycle dependent error. Graph 600 represents an example variation of control signal 122 with time and identical to graph 502. Graph 604 represents an example variation of current 138 with time in CrCM and is identical to graph 504. Graph 606 represents an example variation of the $V_{CAP}$ voltage with time. Referring to graph 606, at trip point times such as $t_{0\_1}$, $t_{1\_1}$, and $t_{2\_1}$ when current 138 moves above or below the average current (and measurement currents 307/311), and the state of control signal 448 provided by OR logic gate 405 switches as a result, the $V_{CAP}$ voltage can be shifted by an offset voltage $V_{offset}$ equal to $V_{PP}$ (peak-to-peak ripple voltage of $V_{CAP}$). For example, at $t_{0\_1}$ and the $t_{2\_1}$, the $V_{CAP}$ voltage is reduced by $V_{offset}$ as charge pump circuit 406 switches from discharging to charging of capacitor 414. Also, at $t_{1\_1}$, the $V_{CAP}$ voltage is increased by $V_{offset}$ as charge pump circuit 406 switches from charging to discharging of capacitor 414. With such arrangements, the $V_{CAP}$ voltage can be brought to a value representing the average of current 138, and the trip points can be brought back onto the average of current 138 (represented by $I_{avg1}$), which can mitigate or eliminate the duty cycle error component.

Figure 7:
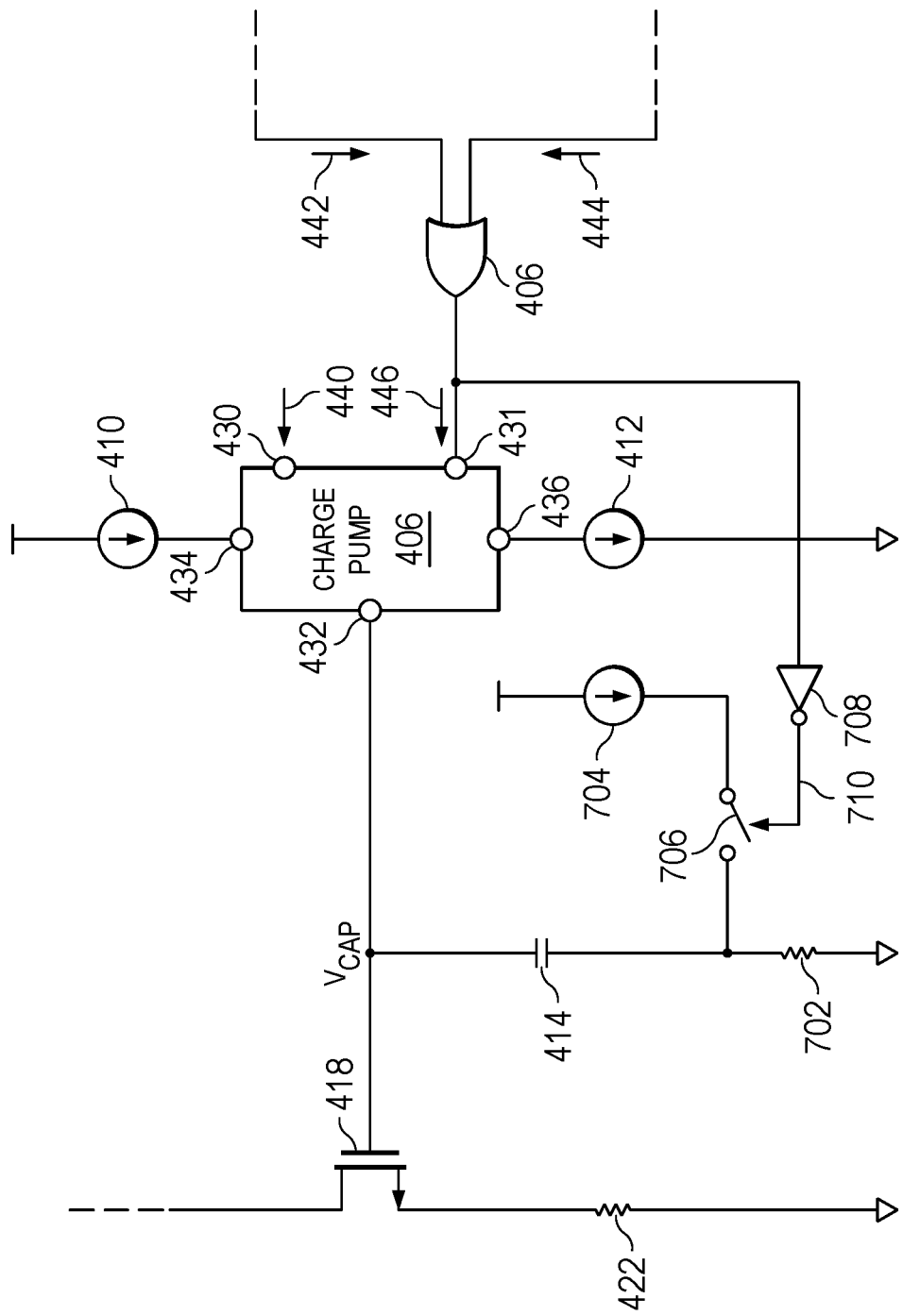
FIG. 7 is a schematic illustrating example internal components of an average current measurement circuit supporting the operations illustrated in FIG. 6.

FIG. 7 includes example components of the processing circuit 316 of FIG. 6 to support the operations illustrated in FIG. 6. In FIG. 7, only part of processing circuit 316 is illustrated. Referring to FIG. 7, processing circuit 316 includes a resistor 702 coupled between another terminal (e.g., a bottom plate) of capacitor 414 and the ground. Processing circuit 316 also includes a current source 704, a switch 706, and an inverter 708. Switch 706 can be coupled between current source 704 and the bottom plate of capacitor 414 and resistor 702. A control terminal of switch 706 is coupled to an output of inverter 708. The input of inverter 708 is coupled to the output of OR logic gate 405.

Specifically, switch 706 can be enabled or disabled responsive to control signal 448 switching states to set the amount of current that flows through resistor 702, which sets the voltage across resistor 702 and adds or subtracts the $V_{offset}$ from the $V_{CAP}$ voltage. The resistance of resistor 702, and the current provided by current source 704, can be configured to achieve a particular $V_{offset}$. For example, the resistance of resistor 702 can be equal to $$\frac{T}{2C_{cp}},$$

where T represents the switching cycle period and $C_{cp}$ represents the capacitance of capacitor 414, as described above. Also, current source 704 can provide a current that is three times of the current provided by current source 410 (e.g., $3 \times I_{cp}$).

Within the time when charge pump circuit 406 discharges capacitor 414 (e.g., between $t_{1\_1}$ and $t_{2\_1}$ of FIG. 6) with the current $I_{CP}$ sunk by current sink 412, switch 706 can be enabled to inject $3 \times I_{cp}$ of current into resistor 702, so that the net current through resistor 702 is $2 \times I_{cp}$. Also, within the time when charge pump 306 charges capacitor 414 (e.g., between $t_{0\_1}$ and $t_{1\_1}$ of FIG. 6) with the current $I_{CP}$ provided by current source 410, switch 706 can be disabled, so that the net current through resistor 702 is $I_{cp}$. Accordingly, the current through resistor 702 is either $I_{cp}$ or $2\times I_{cp}$, and the voltage step across resistor 702 equals $$\frac{T}{2C_{cp}} \times I_{cp}.$$

This allows shifting of the $V_{CAP}$ voltage by the offset voltage $V_{offset}$ equal to $V_{PP}$ at the trip point times as shown in FIG. 6.

Figure 8:
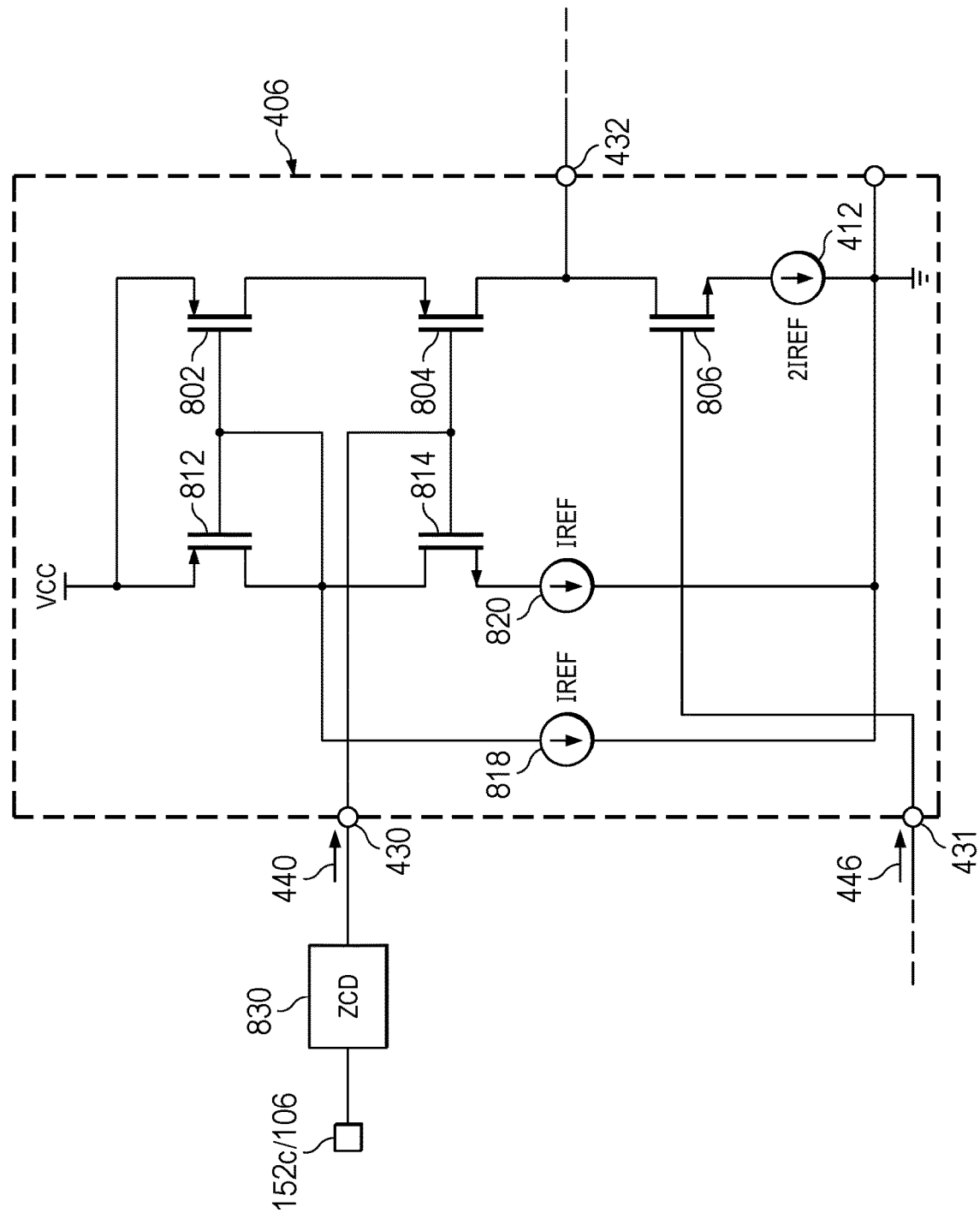
FIG. 8 is a schematic illustrating example internal components of the average current measurement circuit of FIGS. 3, 4, and 7.

FIG. 8 illustrates an example of internal components of charge pump circuit 406 and current source 410. Referring to FIG. 8, charge pump circuit 406 includes transistors 802, 804, and 806. Transistor 802 is coupled to a power supply terminal (e.g., VCC) and can represent current source 410. Transistor 804 can represent a first switch of charge pump circuit 406. Transistor 804 has a control terminal coupled to control input 430 and is coupled between current source 410 and output 432. Transistor 806 can represent a second switch of charge pump circuit 406. Transistor 806 has a control terminal coupled to control input 431 and is coupled between output 432 and current sink 412. Current sink 412 can sink a current equal to $2\times I_{cp}$.

Also, charge pump circuit 406 includes a bias generator circuit including transistors 812, 814, and current sinks 818 and 820. Transistor 812 is diode-connected and coupled between the power supply terminal and current sink 818, which sinks a current equal to $I_{cp}$. The control terminal of transistor 812 is coupled to the control terminal of transistor 802, and transistor 812 provides a bias voltage to transistor 802 to set the amount of current provided by transistor 802 (current source 410).

Also, transistor 814 is coupled between transistor 812 and current sink 820, which also sinks a current equal to $I_{cp}$. The control terminal of transistor 814 is also coupled to control input 430 to receive control signal 440. Transistor 814 can be an opposite type of transistor from transistor 804. For example, transistor 814 can be an NFET, and transistor 804 can be a PFET. Accordingly, when transistor 814 is turned off by control signal 440, transistor 804 can be turned on by control signal 440, and vice versa.

In some examples, processing circuit 316 may include a zero current detection (ZCD) circuit 830 coupled between input 152c (coupled to switching terminal 106) and control input 430 of charge pump circuit 406. ZCD circuit 830 can provide control signal 440 based on whether current 138 is zero or non-zero. If current 138 is zero, both 102 and 108 are off, and ZCD circuit 830 can set control signal 440 to a high state. If current 138 is non-zero, either 102 or 108 is on, and ZCD circuit 830 control signal 440 to a low state. Control signal 440 can have a duty cycle $D_{HIZ}$ representing the percentage of time when inductor current is zero. $D_{HIZ}$ can be zero for CCM and CrCM operations, and can be non-zero (e.g., based on $(t_2-t_2')/T_{SW}$ in FIG. 2) for DCM.

For CCM and CrCM operations, $D_{HIZ}$ is zero. Accordingly, in each switching cycle, transistor 814 can be disabled, while transistor 804 is enabled, and transistor 802 is biased by transistor 812 to supply a current $I_{cp}$ to output 432. When transistor 806 is enabled responsive to control signal 446 having a high state (which indicates measurement currents 307/311 is lower than current 138), transistor 804 connects output 432 to current sink 412, which sinks a current of $2\times I_{cp}$. Accordingly, a net current of $I_{cp}$ flows out of and discharges capacitor 414, and the $V_{CAP}$ voltage and the measurement currents 307/311 reduce with time. Also, when transistor 804 is disabled responsive to control signal 446 having a low state (which indicates measurement currents 307/311 is higher than current 138), output 432 is disconnected from current sink 412, and a net current of $I_{cp}$ flows into and charges capacitor 414, and the $V_{CAP}$ voltage and the measurement currents 307/311 increase with time.

On the other hand, in DCM operation, $D_{HIZ}$ is non-zero, and transistor 814 can be enabled (and transistor 812 is connected to current sink 820) for a percentage of operation time, with the percentage given by $D_{HIZ}$. Accordingly, the average current through transistor 812 equals a sum of the current sunk by current sink 818 ($I_{cp}$) and an average of current through transistor 812 ($I_{cp}\times D_{HIZ}$), which equals $I_{cp}\times(1+D_{HIZ})$. Transistor 802 can also be biased by transistor 812 to provide an average current of $I_{cp}\times(1+D_{HIZ})$. Also, because transistors 814 and 804 have opposite types, transistor 804 is turned on for a percentage of time equal to $(1-D_{HIZ})$, and the average current provided by transistor 802 through transistor 804 equals $I_{cp}\times(1+D_{HIZ})\times(1-D_{HIZ})$, which equals $I_{cp}\times(1-D_{HIZ}^2)$. Accordingly, when transistor 804 is enabled to discharge capacitor 414, the net current that flows out of capacitor 414 is $I_{cp}\times(1+D_{HIZ}^2)$, and when transistor 804 is disabled to charge capacitor 414, the current that flows into capacitor is $I_{cp}\times(1-D_{HIZ}^2)$. Such arrangements can correct for the average inductor current when the current is discontinuous (in DCM) and is at zero for a non-zero duration in each switching cycle, and allow the $V_{CAP}$ and $V_{buf}$ voltages to track the actual average inductor current.

Figure 9:
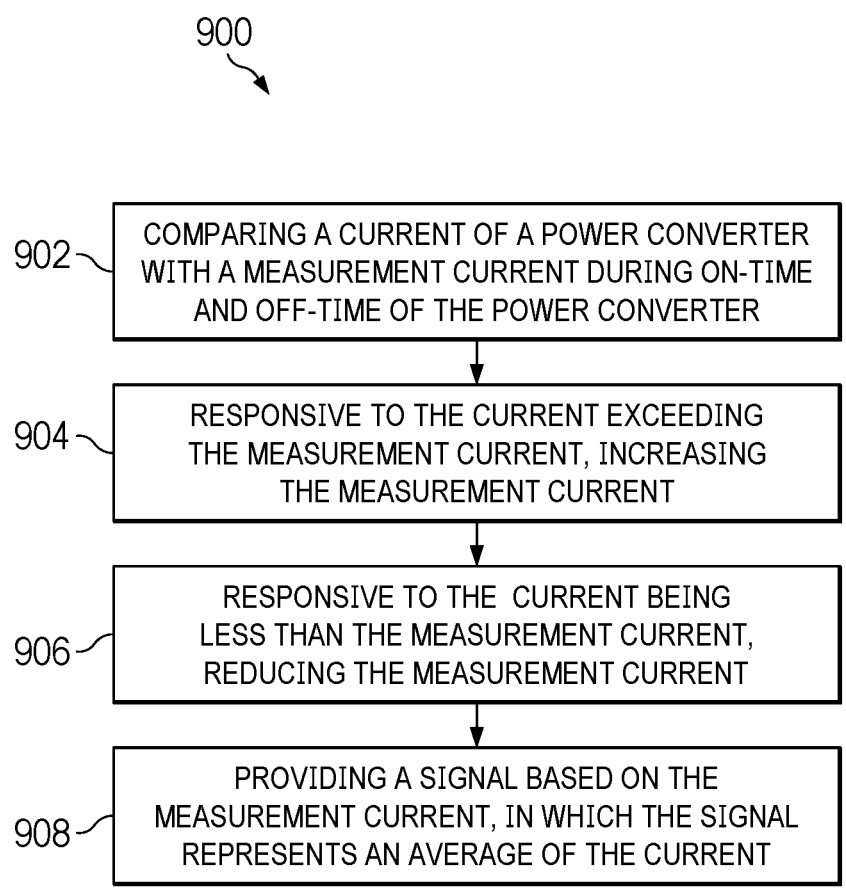
FIG. 9 is a flowchart illustrating an example method of measuring an average current of a power converter.

FIG. 9 illustrates a flowchart of an example method 900 of measuring an average current of a power converter, such as power converter 100. Method 900 can be performed by, for example, average current measurement circuit 142 illustrated in FIG. 1A-FIG. 8.

In operation 902, average current measurement circuit 142 can compare a current (e.g., current 138) of the power converter with a measurement current during on-time and off-time of the power converter. Referring to FIGS. 3 and 5, during the on-time of the power converter, the comparison can be performed by comparator 306 by comparing current 138 through transistor 102 and measurement current 307 provided by variable current source 304. The comparison can be based on comparing the voltage drop across transistor 102 caused by current 138 and the voltage drop across sense transistor 302 caused by measurement current 307.

Also, during the off-time of the power converter, the comparison can be performed by comparator 312 by comparing current 138 through transistor 108 and measurement current 311 provided by variable current source 310. The comparison can be based on comparing the voltage drop across transistor 108 caused by current 138 and the voltage drop across sense transistor 308 caused by measurement current 311.

In operation 904, responsive to the current exceeding the measurement current, average current measurement circuit 142 can increase the measurement current. Also, in operation 906, responsive to the current being below the measurement current, average current measurement circuit 142 can increase the measurement current.

Specifically, average current measurement circuit 142 can include a charge pump circuit 406 having an output coupled to a terminal (e.g., top plate) of capacitor 414, and bias generator circuit 416 to generate bias signals 340 and 342 for the respective variable current sources 304 and 310 based on the voltage at the terminal of capacitor 414 ($V_{CAP}$). Charge pump circuit 406 can receive control signal 446 representing the output of comparator 306 (during the on-time) and the output of comparator 312 (during the off-time). The measurement current can represent an average of the current. Responsive to control signal 446 indicating that the current is below the average (and the measurement current), charge pump circuit 406 can discharge capacitor 414 to reduce $V_{CAP}$ and reduce measurement currents 307/311. Also, responsive to control signal 446 indicating that the current is above the average (and the measurement current), charge pump circuit 406 can charge capacitor 414 to increase $V_{CAP}$ and increase measurement currents 307/311. As the charge pump circuit 406 repeatedly charge and discharge capacitor 414 based on the comparison result, in steady state where the amounts of increase and decrease of $V_{CAP}$ become equal in each switching cycle of control signal 446, $V_{CAP}$ can converge to a value that represents the average of current 138.

In some examples, as described in FIG. 7, responsive to switching of control signal 446, an offset can be added or subtracted from $V_{CAP}$ to reduce a duty cycle dependent error component, which allows $V_{CAP}$ to provide a more accurate representation of the average of current 138.

In operation 906, average current measurement circuit 142 can provide a signal, such as voltage signal 160, based on the measurement current, and the signal represents an average of current 138. For example, average current measurement circuit 142 can provide voltage signal 160 as a buffered version of the $V_{CAP}$ voltage ($V_{BUF}$), and generate bias signals 340 and 342 based on $V_{BUF}$.

In this description, the term "couple" may cover connections, communications or signal paths that enable a functional relationship consistent with this description. Accordingly, if device A generates a signal to control device B to perform an action, then: (a) in a first example, device A is coupled directly to device B; or (b) in a second example, device A is coupled to device B through intervening component C if intervening component C does not substantially alter the functional relationship between device A and device B, so device B is controlled by device A via the control signal generated by device A.

A device "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or packaged integrated circuit (IC)) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices described herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means within +/−10 percent of the stated value, or, if the value is zero, a reasonable range of values around zero. Modifications are possible in the described examples, and other implementations are possible, within the scope of the claims.

What is claimed is:

1. An apparatus comprising:
   a variable current source coupled to a sense terminal, the variable current source having a current control terminal; and
   a processing circuit having a processing input, a bias output, and a processing output, the processing input coupled to the sense terminal, the bias output coupled to the current control terminal, and the processing circuit configured to, responsive to a state of the processing input, set a state of the bias output and provide a signal at the processing output indicative of a current at the sense terminal.

2. The apparatus of claim 1, wherein the sense terminal is a first sense terminal, the variable current source is a first variable current source, the current control terminal is a first current control terminal, the bias output is a first bias output, the current is a first current, the processing input is a first processing input, and the apparatus further comprises:
   a first transistor coupled between a power terminal and a switching terminal, the first transistor having a first control terminal;

a second transistor coupled between the power terminal and the first sense terminal, the second transistor having a second control terminal coupled to the first control terminal;

a third transistor coupled between the switching terminal and a ground terminal, the third transistor having a third control terminal;

a fourth transistor coupled between a second sense terminal and the ground terminal, the fourth transistor having a fourth control terminal coupled to the third control terminal;

a second variable current source coupled to the second sense terminal, the second variable current source having a second current control terminal;

a first comparator having first comparator inputs and a first comparator output, a first one of the first comparator inputs coupled to the first sense terminal, a second one of the first comparator inputs coupled to the switching terminal, and the first comparator output is coupled to the first processing input; and a second comparator having second comparator inputs and a second comparator output, a first one of the second comparator inputs coupled to the second sense terminal, and a second one of the second comparator inputs coupled to the ground terminal; and wherein the processing circuit has a second processing input coupled to the second comparator output, and the processing circuit is configured to provide the signal indicative of an average of a second current conducted by the first and third transistors.

3. The apparatus of claim 2, wherein the processing circuit has third and fourth processing inputs, the third processing input coupled to the first control terminal, and the fourth processing input coupled to the third control terminal.

4. The apparatus of claim 3, wherein the processing circuit includes:
an OR logic gate having first and second inputs and an output, the first input of the OR logical gate coupled to the first processing input, the second input of the OR logical gate coupled to the second processing input, and an output of the OR logic gate coupled to the processing output;

a first AND logic gate having a first input coupled to the first comparator output and a second input coupled to the third processing input, an output of the first AND logic gate coupled to the first input of the OR logic gate; and a second AND logic gate having a first input coupled to the second comparator output and a second input coupled to the fourth processing input, an output of the second AND logic gate coupled to the second input of the OR logic gate.

5. The apparatus of claim 4, wherein the processing circuit includes:
a current source and a current sink;
a charge pump circuit having a first current terminal coupled to the current source, a second current terminal coupled to the current sink, a control input coupled to the output of the OR logic gate, and an output; and
a capacitor coupled between the output of the charge pump circuit and the ground terminal,
wherein the output of the charge pump circuit is coupled to the processing output.

6. The apparatus of claim 5, wherein the control input is a first control input, and the charge pump circuit has a second control input coupled to the switching terminal.

7. The apparatus of claim 6, wherein the charge pump circuit includes:
a first switch coupled between the first current terminal and the output, the first switch having a first switch control terminal coupled to the second control input; and
a second switch coupled between the output and the second current terminal, the second switch having a second switch control terminal coupled to the first control input.

8. The apparatus of claim 5, wherein the bias output is a first bias output, the processing circuit has a second bias output and includes a bias generator circuit having an input coupled to the output of the charge pump circuit, a first output coupled to the first bias output, a second output coupled to the second bias output, and a third output coupled to the processing output.

9. The apparatus of claim 8, wherein the bias generator circuit includes:
a voltage buffer circuit having an input coupled to the input of the bias generator circuit, and an output coupled to the processing output, and a current terminal;
a resistor coupled between the output of the voltage buffer circuit and the ground terminal;
a first diode-connected transistor coupled to the current terminal, a control terminal of the first diode-connected transistor coupled to the first bias output;
a current mirror having an input coupled to the first bias output; and
a second diode-connected transistor coupled to an output of the current mirror, a control terminal of the second diode-connected transistor coupled to the second bias output.

10. The apparatus of claim 9, wherein the processing circuit is configured to add or subtract a voltage from the capacitor responsive to a switching of a state of the output of OR logic gate.

11. The apparatus of claim 5, wherein the processing circuit includes:
a resistor coupled between the capacitor and the ground terminal;
a third current source; and
a switch coupled between the third current source and the resistor, a control terminal of the switch coupled to the output of the OR logic gate.

12. The apparatus of claim 11, wherein a resistance of the resistor is based on half of a switching cycle period of the first and second transistors and a capacitance of the capacitor; and
wherein the third current source is configured to provide a first current based on a second current provided by the charge pump circuit to charge or discharge the capacitor.

13. The apparatus of claim 2, further comprising a control signal generator having a control input and first and second control outputs, the control input coupled to the processing output, the first control output coupled to the first control terminal, and the second control output coupled to the third control terminal.

14. The apparatus of claim 1, wherein the variable current source and the processing circuit is part of a control circuit of a power converter.

15. The apparatus of claim 14, wherein the power converter is a buck converter, a boost converter, or any combination thereof.

16. An apparatus comprising:
a first transistor, the first transistor having a first control terminal;
a second transistor coupled to a sense terminal, the second transistor having a second control terminal coupled to the first control terminal;
a variable current source coupled to the sense terminal, the variable current source having a current control terminal;
a processing circuit having a processing input, a bias output, and a processing output, the processing input coupled to the sense terminal, and the bias output coupled to the current control terminal; and
a control signal generator having a control input and a control output, the control input coupled to the processing output, and the control output coupled to the first control terminal.

17. The apparatus of claim 16, wherein the first transistor is coupled between a power terminal and a switching terminal, the sense terminal is a first sense terminal, the variable current source is a first variable current source, the current control terminal is a first current control terminal, the bias output is a first bias output, the processing input is a first processing input, and the apparatus further comprises:
a third transistor coupled between the switching terminal and a ground terminal, the third transistor having a third control terminal;
a fourth transistor coupled between a second sense terminal and the ground terminal, the fourth transistor having a fourth control terminal coupled to the third control terminal;
a second variable current source coupled to the second sense terminal, the second variable current source having a second current control terminal;
a first comparator having first comparator inputs and a first comparator output, a first one of the first comparator inputs coupled to the first sense terminal, a second one of the first comparator inputs coupled to the switching terminal, and the first comparator output coupled to the first processing input; and
a second comparator having second comparator inputs and a second comparator output, a first one of the second comparator inputs coupled to the second sense terminal, and a second one of the second comparator inputs coupled to the ground terminal;
wherein the processing circuit has a second processing output coupled to the second comparator output, and the processing circuit is configured to provide a first signal representing an average of a current through the first and third transistors; and
wherein the control output is a first control output, and control signal generator has a second control output and is configured to provide a first control signal at the first control output and a second control signal at the second control output responsive to the first signal.

18. The apparatus of claim 17, wherein the power terminal is a power output terminal, and the apparatus further comprises an inductor coupled between a power input terminal and the switching terminal.

19. The apparatus of claim 17, wherein the processing circuit is configured to set duty cycles of the first and second control signals responsive to the first signal.

20. The apparatus of claim 17, further comprising an inductor coupled between the switching terminal and a power output terminal.

21. The apparatus of claim 16, wherein the first and second transistors, the variable current source, the processing circuit, and the control signal generator is part of a power converter.

22. The apparatus of claim 21, wherein the power converter is a buck converter, a boost converter, or any combination thereof.

23. A method comprising:
comparing a first current of a power converter with a second current during on-time and off-time of the power converter;
responsive to the first current exceeding the second current, increasing the second current;
responsive to the first current being less than the second current, reducing the second current; and
providing a signal responsive to the second current, in which the signal represents an average of the first current.

24. The method of claim 23, further comprising:
generating a bias voltage based on a second voltage at a terminal of a capacitor; and
generating the second current by providing the bias voltage to a controllable current source,
wherein increasing the second current includes charging the capacitor, and decreasing the second current includes discharging the capacitor.

25. The method of claim 24, wherein the signal is based on the second voltage.

26. The method of claim 24, further comprising: adjusting the second voltage by an offset responsive to switching between charging and discharging of the capacitor.

* * * * *